(12) United States Patent
Jee et al.

(10) Patent No.: US 7,494,835 B2
(45) Date of Patent: Feb. 24, 2009

(54) METHOD FOR MANUFACTURING THIN FILM TRANSISTOR SUBSTRATE USING MASKLESS EXPOSING DEVICE

(75) Inventors: Young Seung Jee, Gyeonggi-do (KR); Suhyuk Kang, Seoul (KR); Jeong Oh Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 232 days.

(21) Appl. No.: 11/646,482

(22) Filed: Dec. 28, 2006

(65) Prior Publication Data

US 2007/0275512 A1 Nov. 29, 2007

(30) Foreign Application Priority Data

May 25, 2006 (KR) .................... 10-2006-0046986

(51) Int. Cl.
*H01L 21/84* (2006.01)
(52) U.S. Cl. ................................. 438/30; 257/E21.561
(58) Field of Classification Search .................. 438/30, 438/151–166; 257/E21.561
See application file for complete search history.

(56) References Cited

U.S. PATENT DOCUMENTS 6,100,132 A * 8/2000 Sato et al. .................. 438/243

\* cited by examiner

*Primary Examiner*—Richard A. Booth
(74) *Attorney, Agent, or Firm*—Holland & Knight LLP

(57) ABSTRACT

A method for manufacturing a thin film transistor substrate using a maskless exposing device includes forming a data metal layer on a substrate having a gate pattern and common electrodes along with gate insulation layers, active layers, and ohmic contact layers for a thin film transistors; forming a photoresist on the data metal layer; exposing a first amount of light onto the photoresist at first regions, excluding a second region where data lines and thin film transistors are to be formed, by using a maskless exposing device; exposing a second amount of light onto the photoresist at third regions, where channels of the thin film transistors are to be formed, wherein the second amount of light is smaller than the first amount of light; and developing the first, second and third regions of the photoresist.

17 Claims, 11 Drawing Sheets

112    114

201  112  150  140  130  120  114  100

201

150   140        130          120

152  154   130 156  120                              160

160

L1          L2

METHOD FOR MANUFACTURING THIN FILM TRANSISTOR SUBSTRATE USING MASKLESS EXPOSING DEVICE

This nonprovisional application claims priority under 35 U.S.C. § 119(a) to Patent application No. 2006-0046986 filed in Republic of Korea on May 25, 2006, the entire contents of which are hereby incorporated by reference in its entirety.

BACKGROUND OF THE INVENTION

1. Field of the Invention

Embodiments of the invention relate to a method for manufacturing a thin film transistor (TFT) substrate, an more particularly to a method for manufacturing a thin film transistor (TFT) substrate using a maskless exposing device.

2. Description of the Related Art

In general, a TFT is used to drive each pixel in a flat panel display (FPD), such as a liquid crystal display (LCD), a plasma display panel (PDP), and an organic light emitting diode (OLED). Hereinafter, the LCD having a TFT substrate will be used as an example to describe the use of a TFT to drive a pixel. The LCD displays images by using electrooptical characteristics of liquid crystal molecules. More particularly, the LCD includes a liquid crystal panel, a backlight unit, and a driving circuit unit. The backlight unit provides light to the liquid crystal panel and the driving circuit unit drives the liquid crystal panel.

The liquid crystal panel displays images using light provided from the backlight unit. The liquid crystal panel includes a TFT substrate and a color filter substrate that face each other with a layer of liquid crystal molecules interposed therebetween. A TFT array, which includes TFTs and pixel electrodes arranged in a matrix for applying voltages across the layer of liquid crystal molecules using a common electrode, is formed on the TFT substrate. A color filter array, which includes red, green, and blue color filters for expressing colors, is formed on the color filter substrate.

The process for fabricating the liquid crystal panel having such a structure will be described hereinafter. First, the TFT array is formed on a first substrate made of either glass or plastic. In addition, the color filter array is formed on a second substrate made of either glass or plastic. Subsequently, a liquid crystal material is dropped onto one of the first and second substrates, and then the first and second substrates are attached. Then the attached first and second substrates are cut, thereby completing fabrication of a liquid crystal panel.

In the process of fabricating the liquid crystal panel, the TFT array on the first substrate and the color filter array on the second substrate are formed through a photolithography process, respectively. In both cases, an exposing process is performed by using an exposing device that uses masks. For example, in order to fabricate the TFT array on the first substrate, five sheets of masks are used and an exposing process is performed per each mask. More specifically, a gate pattern, including gate lines and gate electrodes, and common electrodes are formed through a first masking process. Gate insulation layers, active layers and ohmic contact layers are formed through a second masking process. A data pattern, including data lines and source electrodes, and drain electrodes are formed through a third masking process. A passivation layer is formed through a fourth masking process. A transparent conductive pattern, including pixel electrodes, is formed through a fifth masking process. The large number of masks used in the exposing processes makes the TFT fabrication process complicated and takes a large amount of time to fabricate the TFT, which results in degradation of the productivity of the TFT substrate and the LCD having the TFT substrate.

A technique for fabricating the TFT array in which four masks are used and a single exposing process performed for each of the masks has been developed. More specifically, the gate pattern and the common electrodes are formed through a first masking process. The gate insulation layers, the active layers, the ohmic layers, and the data pattern are formed through a second masking process. The passivation layer is formed through a third masking process. The transparent conductive pattern is formed through a fourth masking process. In the four-mask technique above, the mask employed for the second masking process is a partial exposing mask, such as a slit mask or a half-tone mask.

The masks used for fabricating a device are expensive. In particular, the partial exposing mask is considerably expensive compared to other types of masks. This is because a slit pattern has to be accurately formed in the slit mask at a region where a channel of the TFT is to be formed while the half-tone mask has to be appropriately surface-processed to allow only 50 percent light transmission at particular areas. In addition, because a fabrication of the mask is difficult as the mask becomes larger, the mask fabrication cost increases by geometric progression as the size of the LCD increases in size, and accordingly, the unit cost for manufacturing the TFT substrate and the LCD having the TFT substrate increases.

The current tendency is that large-scale first and second substrates are being employed to enhance the productivity and obtain a large-sized LCD. In this respect, however, the size of masks fails to follow the trend because of the technical limitation of the exposing device. Thus, a dividing and exposing method is employed in which the first and second large substrates are divided into a plurality of exposure regions, which are then exposed through a plurality of shots. Herein, the shot refers to exposing a single exposure region, and a size of each exposure region is determined depending on the size of the shot. This will be described in detail with reference to FIGS. 1 and 2.

FIG. 1 is a plan view for explaining the exposing process through a plurality of shots according to the related art, and FIG. 2 is a plan view showing a stitch deficiency generated between adjacent exposure regions of FIG. 1. With reference to FIGS. 1 and 2, a plurality of shots proceed to form the TFT array 14 on the first substrate 10. When the shots are proceeding, distortion, such as a shift, a rotation, and distortion can occur that create shot misalignment and thus generating discontinuity among adjacent shots, such as adjacent exposure regions 18a, 18b, 18c, and 18d of FIG. 1.

Due to shot misalignment, a luminance difference occurs at the boundary regions of the adjacent exposure regions 18a, 18b, 18c, and 18d. The stitch deficiency refers to a phenomenon in which the boundary regions of the adjacent exposure regions 18a, 18b, 18c, and 18d appear to be like a band to human eyes. Such a stitch deficiency causes degradation of picture quality of the LCD.

SUMMARY OF THE INVENTION

Accordingly, embodiments of the invention is directed to a method for manufacturing a thin film transistor (TFT) substrate using a maskless exposing device that substantially obviates one or more of the problems due to limitations and disadvantages of the related art.

An object of embodiments of the invention is to provide a method for manufacturing a thin film transistor (TFT) substrate using a maskless exposing device to improve productivity and reduce manufacturing cost of the TFT substrate and a flat panel display device having the TFT substrate.

Another object of embodiments of the invention is to provide a method for manufacturing a thin film transistor (TFT) substrate using a maskless exposing device to prevent the stitch deficiency.

The foregoing and other objects, features, aspects and advantages of the present invention are not limited to the technical matters as mentioned above and various changes and modifications within the spirit and scope of the invention will become apparent to those skilled in the art from this detailed description.

To achieve these and other advantages and in accordance with the purpose of embodiments of the invention, as embodied and broadly described, a method for manufacturing a thin film transistor substrate using a maskless exposing device includes forming a data metal layer on a substrate having a gate pattern and common electrodes along with gate insulation layers, active layers, and ohmic contact layers for a thin film transistors, forming a photoresist on the data metal layer, exposing a first amount of light onto the photoresist at first regions, excluding a second region where data lines and thin film transistors are to be formed, by using a maskless exposing device, exposing a second amount of light onto the photoresist at third regions, where channels of the thin film transistors are to be formed, wherein the second amount of light is smaller than the first amount of light, and developing the first, second and third regions of the photoresist.

In another aspect, a method for manufacturing a TFT substrate using a maskless exposing device includes forming a gate pattern comprising a gate line and a gate electrode of a TFT, and a common electrode on a substrate through a first process comprising a single exposing process using a maskless exposing device; forming a gate insulation layer, an active layer, and an ohmic contact layer, and a data pattern comprising a data line and a source electrode and a drain electrode of the TFT through a second process comprising two times of exposing process using the maskless exposing device; forming a passivation layer through a third process comprising a single exposing process using the maskless exposing device; and forming a transparent conductive pattern comprising a pixel electrode through a fourth process comprising a single exposing process using the maskless exposing device.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 7 is a cross-sectional view showing the maskless exposing device according to an exemplary embodiment of the invention; and.

DETAILED DESCRIPTION OF THE PREFERRED EMBODIMENTS

Figure 1:
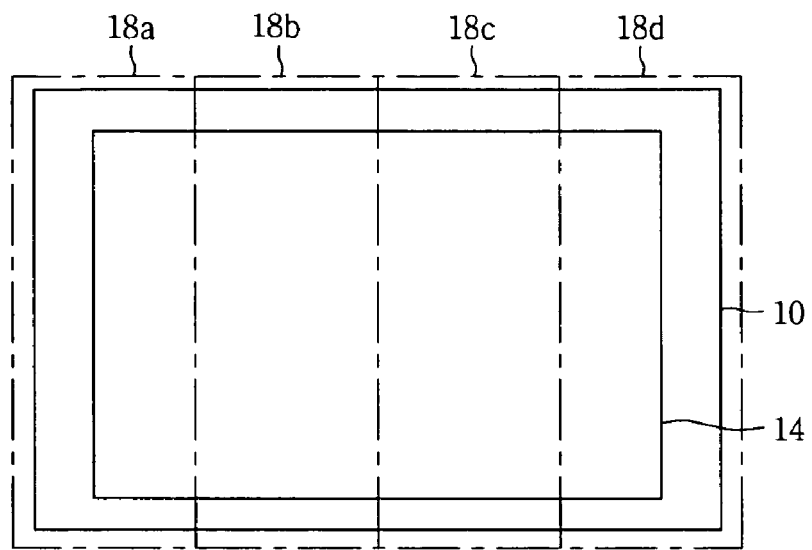
FIG. 1 is a plan view for explaining an exposing process through a plurality of shots according to the related art.
Figure 2:
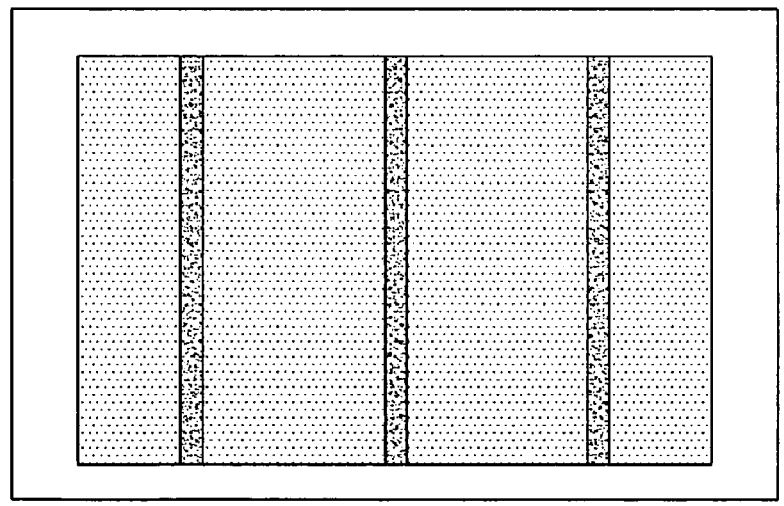
FIG. 2 is a plan view showing stitch deficiency generated between adjacent exposure regions of FIG. 1.

Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be through and complete, and will fully convey the concept of the invention to those skilled in the art. In the drawings, the thicknesses of layers and regions are exaggerated for clarity. Like reference numerals in the drawings denote like elements.

Figure 3:
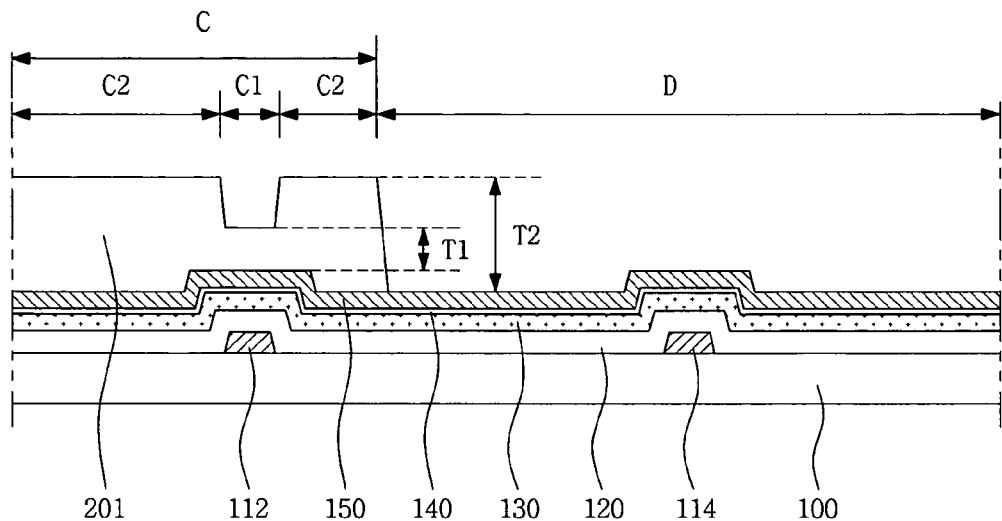
FIG. 3 is a cross-sectional view showing a configuration in which photoresist is formed in multi-stage according to an exposing process using a maskless exposing device and a follow-up developing process according to a first embodiment of the invention.

FIG. 3 is a cross-sectional view showing a configuration in which photoresist is formed in multi-stage according to an exposing process using a maskless exposing device and a follow-up developing process according to a first embodiment of the invention. As shown in FIG. 3, a gate pattern, including gate lines and gate electrodes 112 of a TFT, and common electrodes 114 are formed on a substrate 100 made of either glass or plastic. In addition, a gate insulation layer 120, an active layer 130 and an ohmic contact layer 140 are formed over the substrate 100 having the gate pattern and the common electrodes 114. A data metal layer 150 from which a data pattern, including data line and source electrodes, and drain electrodes of the TFT are to be formed, is formed on the ohmic contact layer 140. Photoresist 201, which will later be used as a mask in etching the data metal layer 150, is formed on the data metal layer 150. Herein, the photoresist 201 may have positive or negative photosensitivity. Hereinafter, the photoresist 201 having a positive photosensitivity will be described as an exemplary embodiment.

The photoresist 201 is formed only at a region (C) where the data lines and the TFTs are to be formed. This is because the photoresist 201 at a region (D), excluding the region (C) where the data lines and the TFTs are to be formed, has been first exposed by the maskless exposing device. Further, the photoresist 201 at the region (C) where the data lines and the TFTs are to be formed has multiple levels. In other words, a thickness (T1) of the photoresist 201 at a region (C1) where TFT channels are to be formed is smaller than a thickness (T2) at a region (C2) where the data lines, the source electrodes and drain electrodes of the TFTs are to be formed. The reason for this is because the photoresist 201 at the region (C1) where the TFT channels are to be formed is secondly exposed with a smaller amount of light than that of the first exposing by the maskless exposing device. For example, the photoresist at the region (C1) where the TFT channels are to be formed can be secondly exposed with 50% of light used in the first exposing process by the maskless exposing device.

Figure 4A:
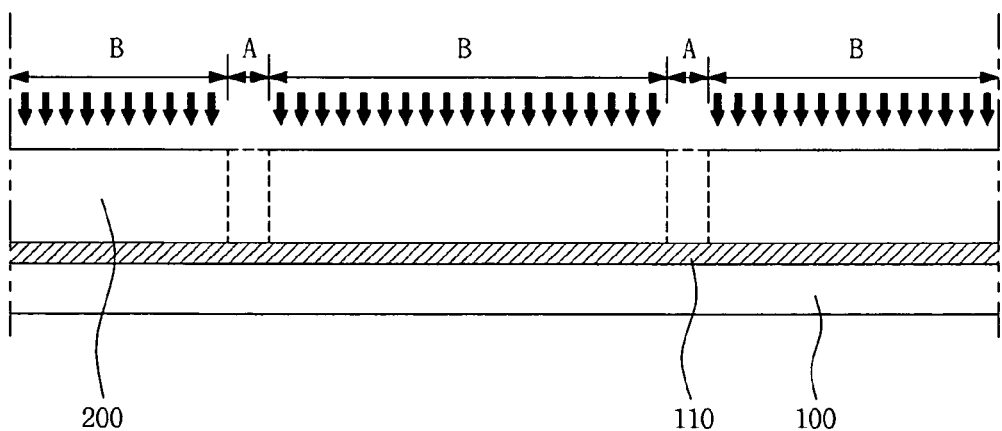
FIGS. 4a to 4m are cross-sectional views showing sequential processes of a method for manufacturing a TFT using the maskless exposing device according to the first embodiment of the invention.
Figure 4B:
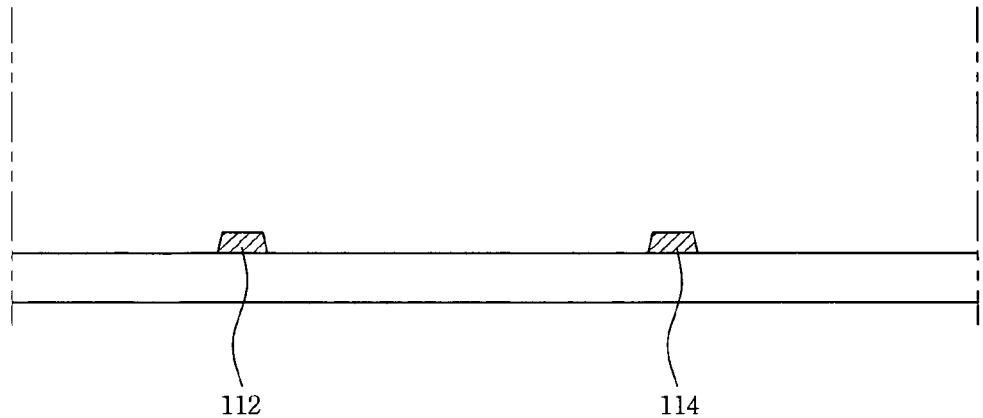

FIGS. 4a to 4m are cross-sectional views showing sequential processes of a method for manufacturing a TFT using the maskless exposing device according to the first embodiment of the invention. Specifically, FIGS. 4a and 4b are cross-sectional views showing a first process, FIGS. 4c to 4i are cross-sectional views showing a second process, FIGS. 4j and 4k are cross-sectional views showing a third process, and FIGS. 4l and 4m are cross-sectional views showing a fourth process. To manufacture the TFT substrate using the maskless exposing device according to the first embodiment of the invention, first, as shown in FIG. 4a, at least one gate metal layer 110, which will subsequently form the gate pattern and the common electrodes, and the photoresist 200 are formed on the substrate 100, and then a single exposing process is performed thereon by using a maskless exposing device. For example, at least one (or more) gate metal layer 110, such as at least one of Cr, Cr alloy, Al, Al alloy, Mo, Mo alloy, Ag, Ag alloy, Cu, Cu alloy, Ti, Ti alloy, Ta, or Ta alloy can be formed on the substrate 100 by sputtering. Next, the photoresist 200 is formed on the gate metal layer 110. The photoresist 200 is formed by one of spin coating, slit coating, spin and slit coating, spinless coating, and printing. And then, the photoresist 200 at regions (B), excluding the photoresist at regions (A) where the gate pattern and the common electrodes are to be formed, are exposed once. Subsequently, the photoresist 200 is developed by using a developer, and then etched and stripped to form the gate pattern, including the gate lines and the gate electrodes 112, and the common electrodes 114, as shown in FIG. 4b.

Figure 4C:
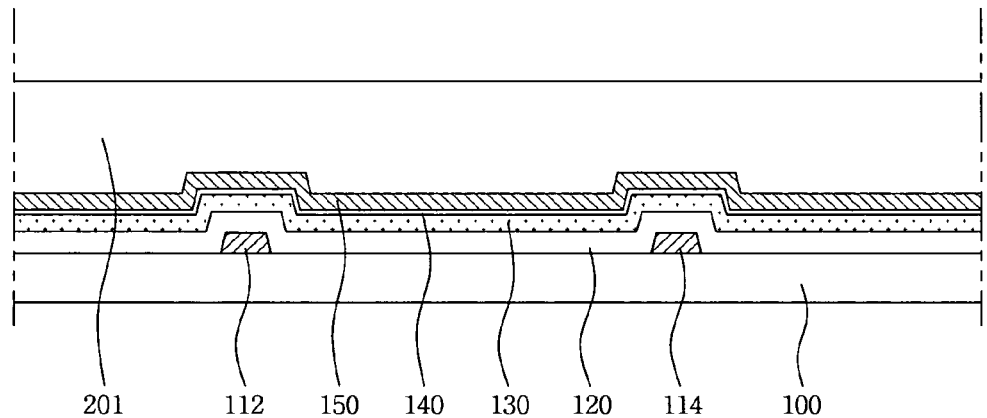
Figure 4D:
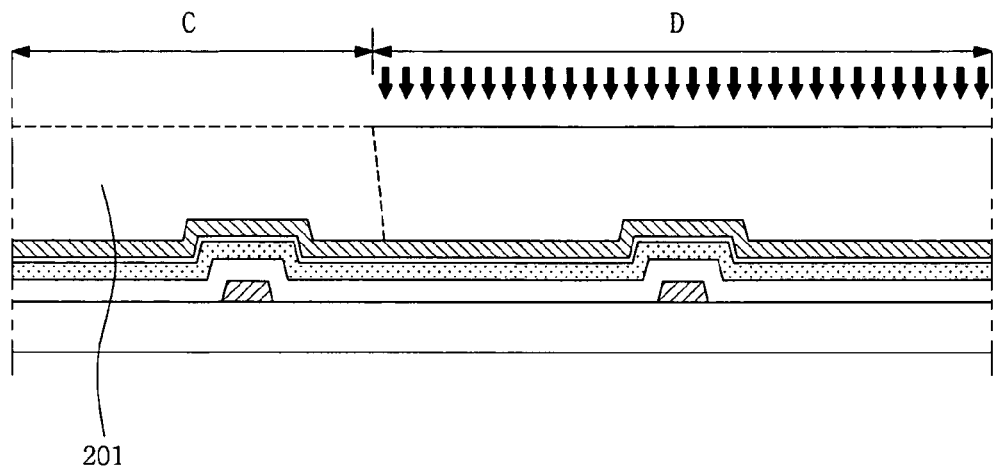

Next, as shown in FIG. 4c, the gate insulation layer 120, the active layer 130 and the ohmic contact layer 140 and the data metal layer 150 are sequentially formed over the substrate 100 having the gate pattern, including the gate lines and the gate electrodes 112, and the common electrodes 114. Then, the photoresist 201 is formed on the data metal layer 150. For example, the gate insulation layer 120 are formed of an inorganic material, such as SiNx and SiOx, over the substrate 100 having the gate pattern, including the gate lines and the gate electrodes 112, and the common electrodes 114. And then, an active layer 130, such as an amorphous silicon layer, is formed on the gate insulation layer 120. Then, an ohmic contact layer 140, such as an amorphous silicon layer having n+ impurities are then formed on the active layer 130. The gate insulation layer 120, the active layer 130, and the ohmic contact layer 140 can be formed by chemical vapor deposition (CVD). Thereafter, one (or more) data metal layers 150, such as at least one of Cr, Cr alloy, Al, Al alloy, Mo, Mo alloy, Ag, Ag alloy, Cu, Cu alloy, Ti, Ti alloy, Ta, or Ta alloy can be formed on the ohmic contact layer 140 by sputtering. The gate insulation layer 120, the active layer 130, the ohmic contact layer 140 and the data metal layer 150 can be successively formed. Subsequently, the photoresist 201 is formed on the data metal layer 150. Then, as shown in FIG. 4d, the photoresist 201 at the region (D), excluding the region (C) where the data lines and the TFTs are to be formed, is exposed a first time by using the maskless exposing device.

Figure 4E:
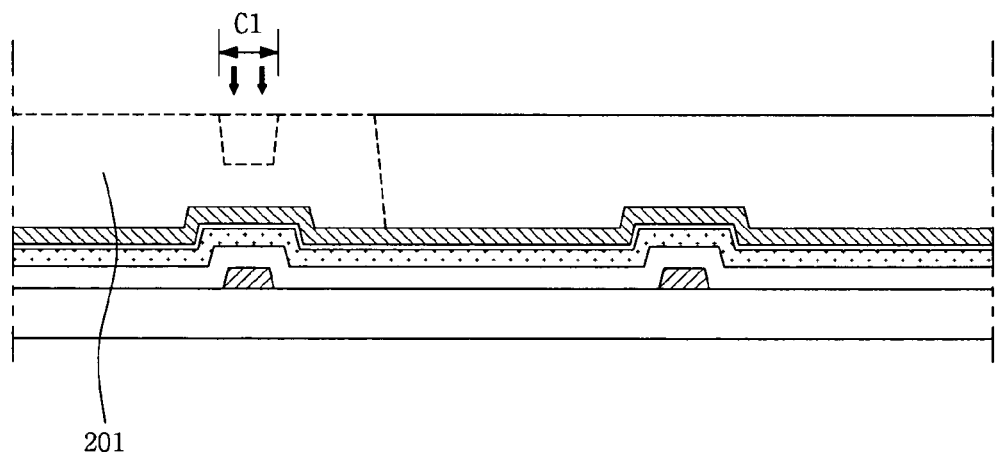

Next, as shown in FIG. 4e, the photoresist 201 at the region (C1) where the TFT channels are to be formed is exposed a second time by using the maskless exposing device. During the second time, a smaller amount of light is used than was used during the first time. For example, the photoresist at the region (C1) can be secondly exposed with 50% of light used in the first exposing process by the maskless exposing device.

Figure 4F:
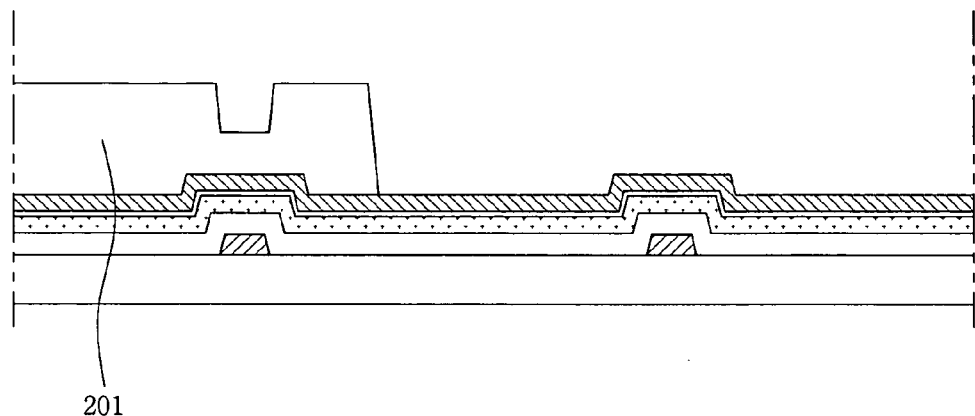

Thereafter, as shown in FIG. 4f, the photoresist 201 is developed by using the developer to make the photoresist 201 have multiple levels.

Figure 4G:
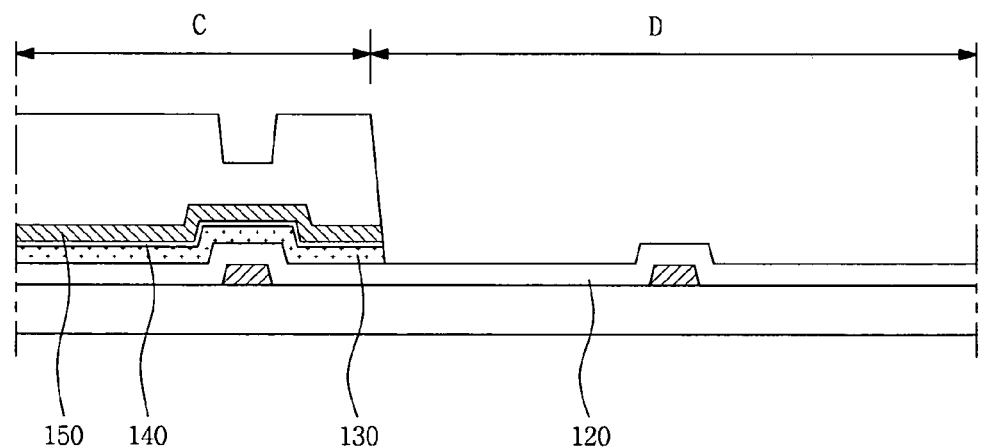

As shown in FIG. 4g, the data metal layer 150, the ohmic contact layer 140, and the active layers 130 are etched together to expose the gate insulation layers 120 at the region (D), excluding the region (C) where the data lines and the TFTs are to be formed.

Figure 4H:
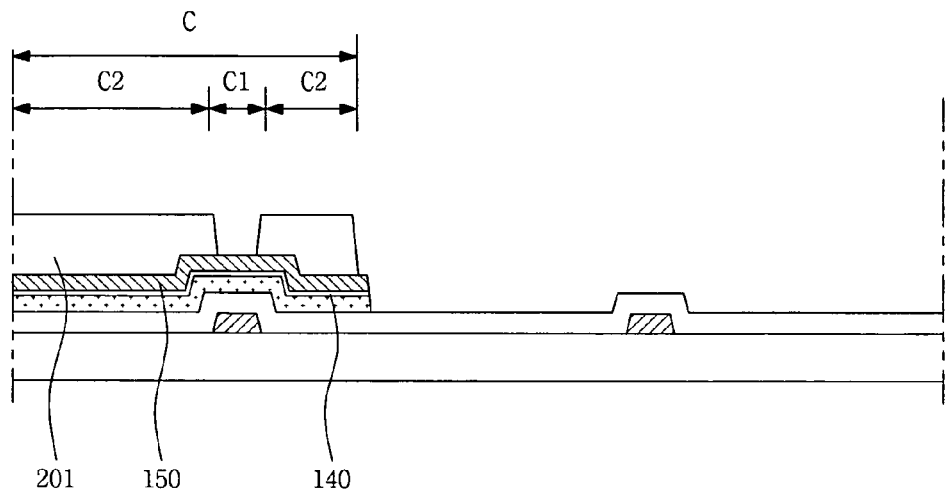

Then, as shown in FIG. 4h, the photoresist 201 at the region (C1) where the TFT channels are to be formed is removed through an ashing process. In this case, the photoresist 201 in second regions (C2) where the data line and the source and drain electrodes of the TFT will be located can be partially removed.

Figure 4I:
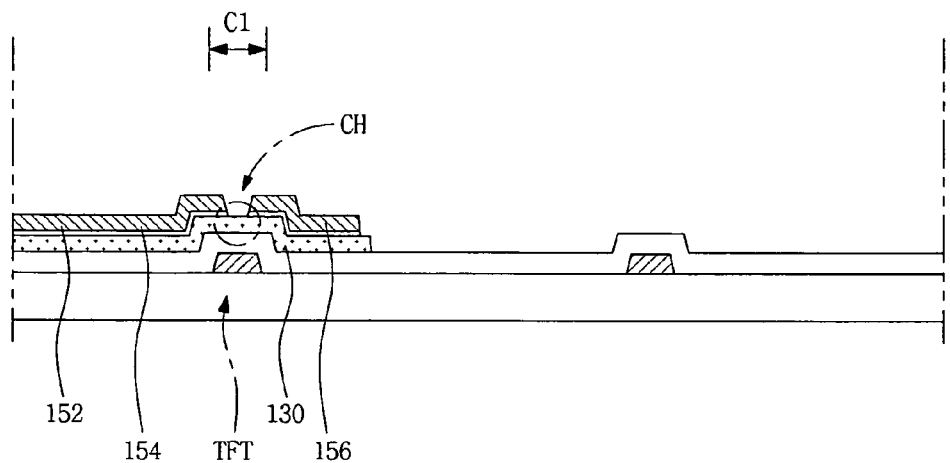
Figure 4J:
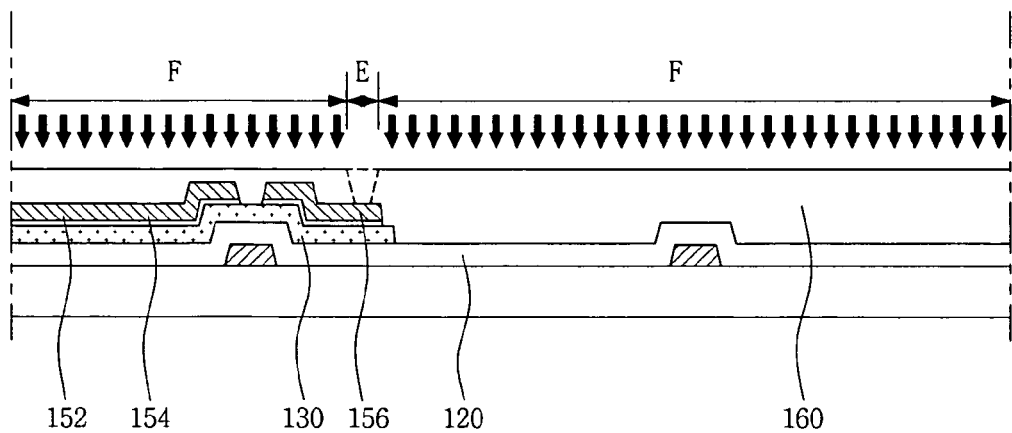
Figure 4K:
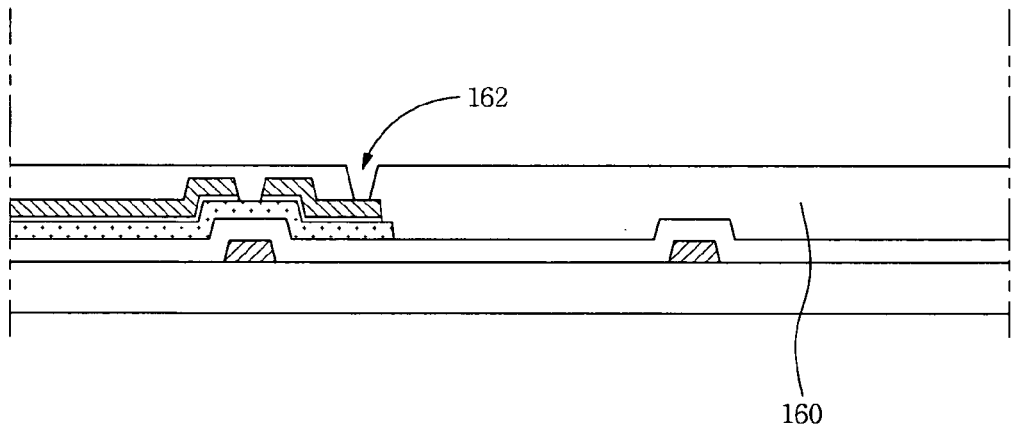
Figure 4L:
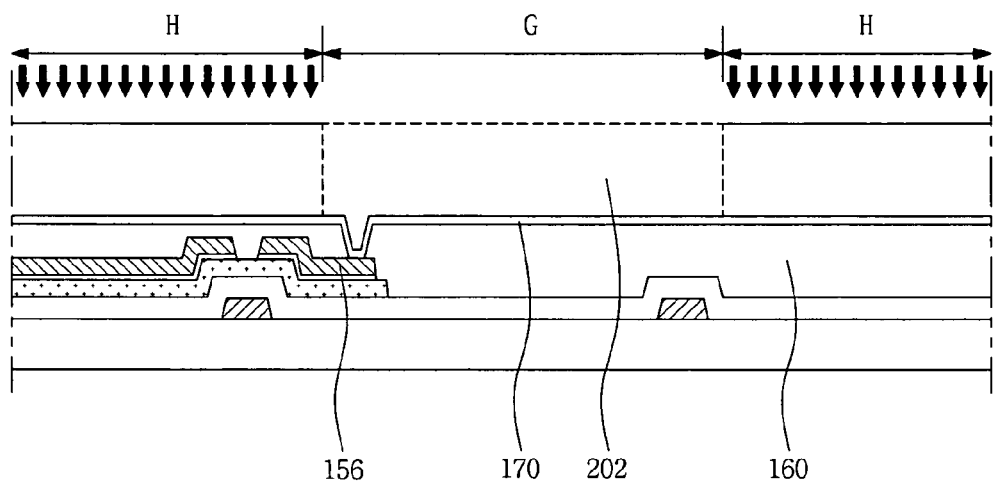
Figure 4M:
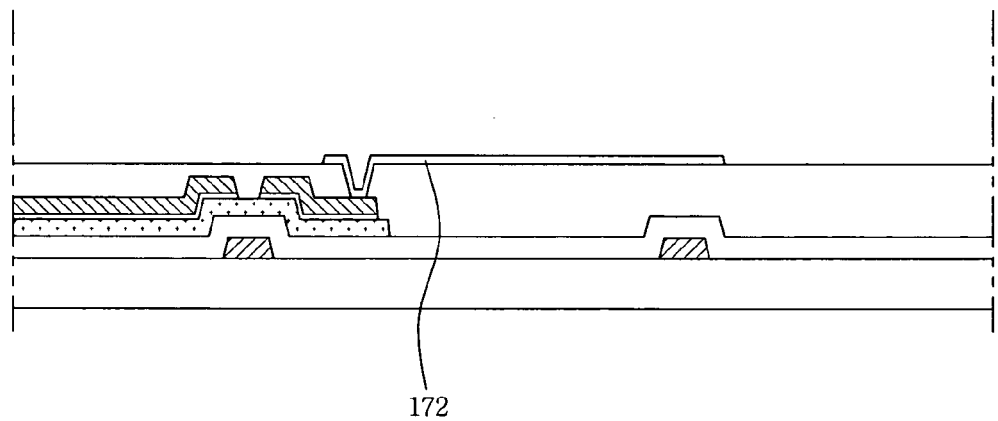

Subsequently, when the data metal layer 150 and the ohmic contact layer 140 in the first regions (C1) where the TFT channels are to be formed are etched and stripped, as shown in FIG. 4i, the data pattern, including the data lines 152 and the source electrodes 154, and the drain electrodes 156 are further patterned. Accordingly, the TFTs are formed when the channels CH of the TFTs have been exposed.

Thereafter, as shown in FIG. 4j, the passivation layer 160 is formed on the substrate 100 including the data patterns, the active layers 130 and the gate insulation layers 120, and then a single exposing process is performed by using the maskless exposing device. For example, the passivation layer 160 is formed with an acryl-based organic material having negative photosensitivity to cover the data patterns, the active layers 130, and the gate insulation layers 120. The passivation layer 160 can be formed by one of spin coating, slit coating, spin and slit coating, spinless coating, and printing. Alternatively, instead of the organic material having negative photosensitivity, an organic material having positive sensitivity can be used. Alternatively, the passivation layer 160 can be formed as one or more layers with an inorganic material, such as SiNx or SiOx, instead of the organic material. Alternatively, the passivation layer 160 can be formed as one or more layers by mixedly using the organic material and the inorganic material.

Thereafter, the passivation layer 160 at regions (F), excluding the region (E) where contact holes expose portions of the drain electrodes 156 are to be formed, are exposed once by using the maskless exposing device. And then, the passivation layer 160 is developed to form the contact holes 162 and the passivation layers 160 as shown in FIG. 4k.

Subsequently, as shown in FIG. 4l, a transparent conductive layer 170 is formed on the passivation layer 160 where the transparent conductive pattern is to be formed and on the drain electrodes 156 exposed by the contact holes 162. The photoresist 202 is formed on the transparent conductive layer 170 and exposed one time using the maskless exposing device. For example, the transparent conductive layer 170, such as ITO and IZO, is formed on the passivation layer 160 and the drain electrodes 156 exposed by the contact holes 162 by a sputtering method. Then, the photoresist 202 is formed at regions (H), excluding a region (G) where the transparent conductive pattern is to be formed, and exposed one time by using the maskless exposing device. Subsequently, the photoresist 202 is developed by the developer, etched and stripped to form the transparent conductive pattern, including the pixel electrodes 172, as shown in FIG. 4m.

Figure 5:
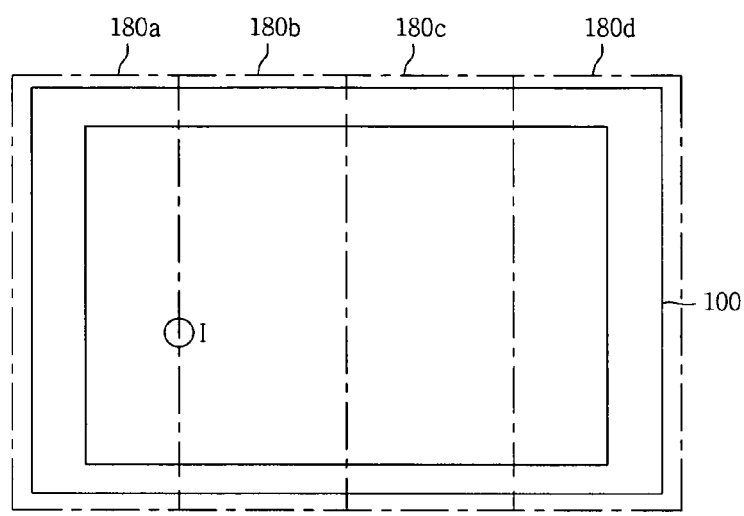
FIG. 5 is a plan view for explaining a method for manufacturing a TFT using a maskless exposing device according to a second embodiment of the invention.
Figure 6:
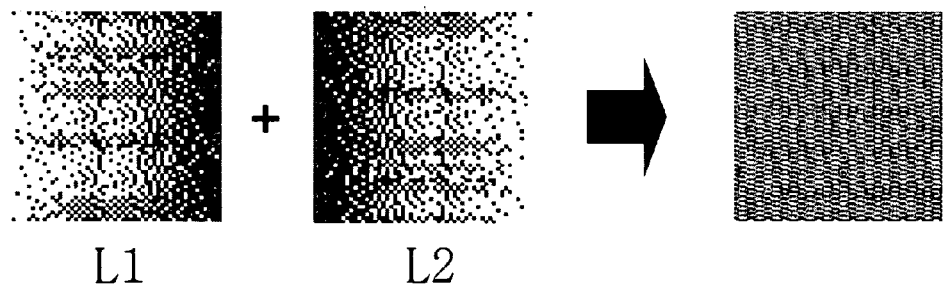
FIG. 6 is a plan view for explaining an exposing method of region 'I' in FIG. 5.

FIG. 5 is a plan view for explaining a method for manufacturing a TFT using a maskless exposing device according to a second embodiment of the invention, and FIG. 6 is a plan view for explaining an exposing method of region 'I' in FIG. 5. With reference to FIGS. 5 and 6, the photoresists for forming the gate pattern and common electrodes through a first process, the gate insulation layers, the active layers, the ohmic contact layers and the data pattern through a second process, and the transparent conductive pattern through a fourth process is are each formed on the substrate 100 divided into a plurality of exposure regions 180a, 180b, 180c, and 180d. The photosensitive passivation layer of the third process is also formed on the substrate 100 divided into a plurality of exposure regions 180a, 180b, 180c, and 180d. Both the photoresists and the photosensitive passivation layer are exposed using a maskless exposing device.

To prevent stitch deficiency that can be generated when the photoresists or the photosensitive passivation layer on the substrate 100 divided into the plurality of exposure regions 180a, 180b, 180c, and 180d is exposed, the regions where the mutually adjacent exposure regions 180a, 180b, 180c, and 180d overlap are designed as lego patterns L1 and L2. Herein, the lego patterns L1 and L2 refer to puzzle-shaped patterns with continuity that can be integrated when overlapped with each other. For example, for region (I) where the exposure regions 180a and 180b overlap, the lego pattern L1 is formed at the exposure region 180a and the lego pattern L2 is formed at the exposure region 180b. Then, the lego patterns L1 and L2 overlap to have continuity during the exposing process by using the maskless exposing device, thus preventing generation of the stitch deficiency.

Figure 7:
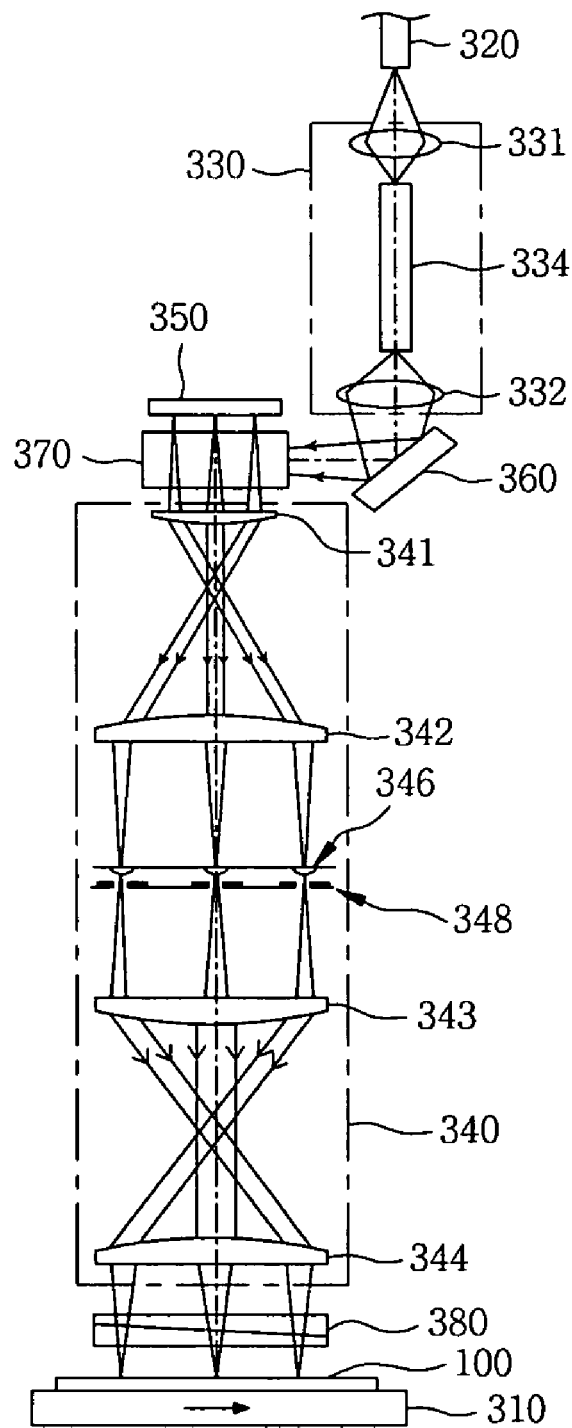
Figure 8:
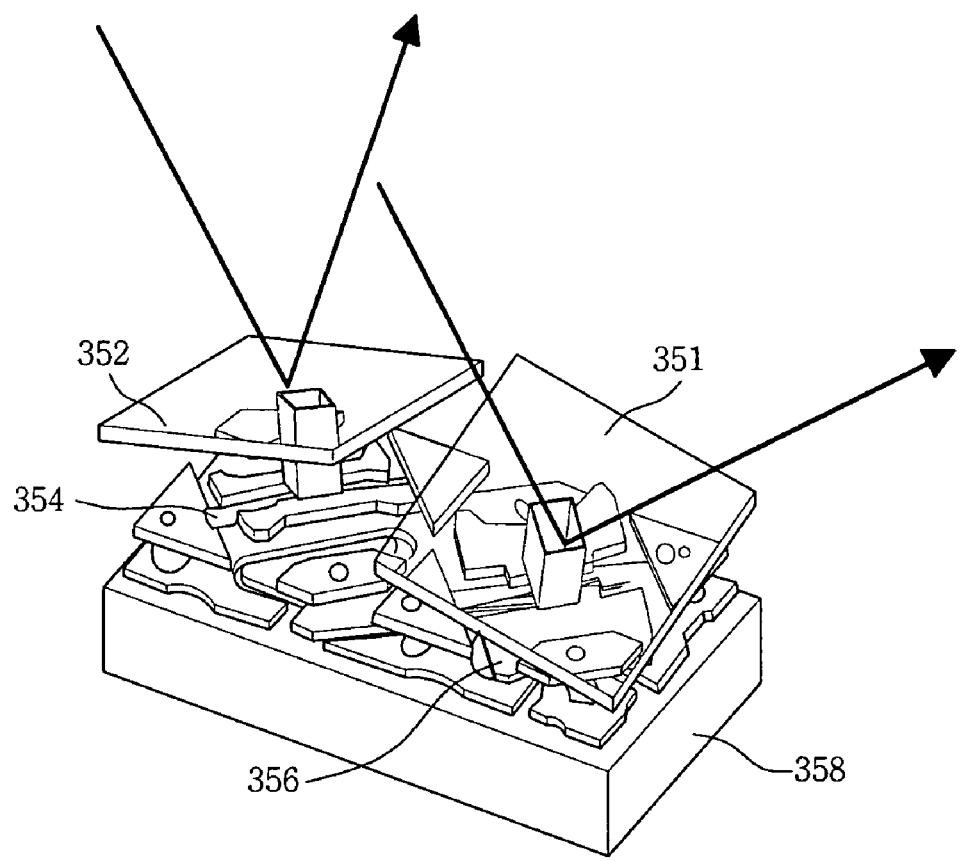
FIG. 8 is a perspective view showing a digital micro-mirror device of FIG. 7.

FIG. 7 is a cross-sectional view showing the maskless exposing device according to an exemplary embodiment of the invention, and FIG. 8 is a perspective view showing a digital micro-mirror device of FIG. 7. With reference to FIG. 7, the maskless exposing device 300 according to the exemplary embodiment of the invention includes a stage 310, a light source unit 320, a light collecting unit 330, an image formation unit 340, and a digital micro-mirror device (DMD) 350, a total reflection prism 370. The stage 310 is formed to be movable along a guide. The substrate 100 is vacuum-held on the stage 310. On the substrate 100, the gate pattern and the common electrodes are formed through a first process, the gate insulation layers 120, the active layers 130, the ohmic contact layers 140, and the data pattern are formed through a second process, the passivation layer is formed through a third process and the transparent conductive pattern is formed through a fourth process.

The light source unit 320 includes at least one lamp for generating light. The light source can have an optical fiber array. More particularly the fiber optic array distributes light from the lamp.

The light collecting unit 330 includes a lens 331 for collecting light emitted from the light source unit 320, a rod-shaped optical integrator 334 formed at a light path of light that has passed through the lens 331, and a lens 332 disposed to face the lens 331 with the rod-shaped optical integrator 334 interposed therebetween.

The image formation unit 340 includes a first image formation optical system including lenses 341 and 342 for expanding light, a second image formation optical system including lenses 343 and 344 for performing a projection lens, a micro-lens array 346 and a mask plate 348 positioned between the first and second image formation optical systems.

As shown in FIG. 8, the DMD 350 includes micro-mirrors 351 and 352 and a memory cell 358 formed at a lower side of the micro-mirrors 351 and 352. The micro-mirrors 351 and 352 are for forming a single pixel. The micro-mirrors 351 and 352 can be arranged in a grating (lattice) shape. For example, the 1024×768 number of micro-mirrors 351 and 352 can be arranged in the grating shape. The arrangement pitch of the micro-mirrors 351 and 352 are a few μm to tens of μm in both horizontal and vertical directions.

The micro-mirrors 351 and 352 reflect light emitted from the light source unit 320 with a material having a high reflectability, such as aluminum, on each surface of the micro-mirrors 351 and 352, respectively. The reflectability of the micro-mirrors 351 and 352 can be 90% or greater.

The micro-mirrors 351 and 352 are supported by props, including a hinge 354 and a yoke 356, formed at their lower side, respectively. The micro-mirrors 351 and 352 can move within a range of $\pm\alpha°$, such as $\pm10°$, with respect to the memory cell 358 centering on a diagonal line, respectively. The movement of the micro-mirrors 351 and 352 is controlled by applying light exposure data stored in the memory cell 358. For example, when the micro-mirror 351 is turned on according to the light exposure data applied thereto, it moves at $+\alpha°$ with respect to the memory cell 358, and the micro-mirror 351 reflects light that is irradiated onto either the photoresist or the photosensitive passivation material.

The turned-on time of the micro-mirror 351 can be controlled to control an amount of light exposure. For example, the turned-on time of the micro-mirror 351 can be shortened to reduce the amount of light, or the turned-on time micro-mirror 351 can be lengthened to increase the amount of light exposure. However, embodiments of invention are not limited to such a light control technique.

When the micro-mirror 352 is turned off according to the light exposure data applied thereto, it moves at $-\alpha°$ with respect to the memory cell 358, and no light is irradiated onto the photoresist or the photosensitive passivation material due to light reflection by the turned-off micro-mirror 352. Light reflected by the turned-off micro-mirror 352 is absorbed by a light absorbing unit. The memory cell 358 stores the light exposure data. The memory cell 358 can be, for example, a CMOS.

The light exposure data stored in the memory cell 358 is data for controlling each movement of the micro-mirrors 351 and 352. As the movement of the micro-mirrors 351 and 352 is controlled by the light exposure data, the photoresist or photosensitive passivation material can have a desired pattern through the exposing process and the follow-up developing process. Herein, the light exposure data can be, for example, data for forming the gate pattern and common electrodes through the first process, the gate insulation layer 120, the active layer 130, the ohmic contact layer 140 and the data pattern through the second process, the passivation layer 160 through the third process, and the transparent conductive pattern through the fourth process. In addition, the light exposure data can be data corresponding to the lego patterns L1 and L2.

The operation of the maskless exposing device 300 constructed as described above will now be explained. First, light emitted from the light source unit 320 passes through the lens 331 so as to be collected to the rod-shaped optical integrator 334. The light proceeds within the rod-shaped optical integrator 334 via total internal reflection. At this time, the light is converted so as to be parallel to the lengthwise direction of the rod-shaped optical integrator 334 and intensity of a section of the light becomes uniform. Subsequently, the light passes through the lens 332, reflected by the mirror 360 and then made incident on the DMD 350 through a total reflection prism 370.

When the light exposure data stored in the memory cell 358 of the DMD 350 is applied to the micro-mirrors 351 and 352, the micro-mirrors 351 and 352 slope within the range of $\pm\alpha°$ with respect to the memory cell 358 centering on the diagonal line, respectively. At this time, the light which has been made incident on the DMD 350 through the total reflection prism 370 is reflected by the micro-mirrors 351 and 352 within the range of $\pm\alpha°$ with respect to the memory cell 358. The light reflected by the micro-mirror 351 sloped at $-\alpha°$ with respect to the memory cell 358 is absorbed through a light absorption unit, while the light reflected by the micro-mirror 352 sloped at +α° with respect to the memory cell 358 proceeds in the direction of the first image formation optical system.

The light, which has proceeded to the first image formation optical system by the DMD 350, is magnified by several times by the first image formation optical system and then imaged to the micro-lens array 346. The light imaged on the micro-lens array 346 proceeds to the second image formation optical system after faint light is removed therefrom. The second image formation optical system magnifies the light after having passed through the micro-lens array 346 several times.

A focus of the light is controlled by moving the prism pair 380 disposed between the second image formation optical system and the substrate 100. Subsequently, the focus-controlled light is irradiated onto the photoresist or photosensitive passivation material at the partial exposure regions 180a, 180b, 180c, and 180d among all the exposure regions 180a, 180b, 180c, and 180d of the substrate 100.

Thereafter, as the stage 310 moves, light is sequentially irradiated onto the photoresist at all the exposure regions 180a, 180b, 180c, and 180d in such a manner that light scans the photoresist or photosensitive passivation material on the substrate 100. Through the series scanning process as described above, the photoresist 200 on the substrate 100 can be exposed once. In this case, by increasing the number of times of scanning, the photoresist or photosensitive passivation material can be formed to have multiple levels after it is developed.

In the method for manufacturing the TFT substrate using the maskless exposing device according to embodiments of the invention, a high-priced mask is not used during the exposing process. Thus, the manufacturing unit cost of the TFT and a flat panel display device having the TFT can be reduced. In addition, because the gate insulation layer, the active layer, the ohmic contact layer, and the data pattern are formed through the second process comprising the two times of exposing process, the productivity of the TFT and the flat panel display device having the TFT can be improved. Moreover, because adjacent exposure regions overlap to be exposed by using the maskless exposing device, generation of stitch deficiency can be prevented.

It will be apparent to those skilled in the art that various modifications and variations can be made in the a method for manufacturing a thin film transistor (TFT) substrate using a maskless exposing device of embodiments of the invention without departing from the spirit or scope of the invention. Thus, it is intended that embodiments of the invention cover the modifications and variations of this invention provided they come within the scope of the appended claims and their equivalents.

What is claimed is:

1. A method for manufacturing a thin film transistor substrate using a maskless exposing device, comprising:
    forming a data metal layer on a substrate having a gate pattern and common electrodes along with gate insulation layers, active layers, and ohmic contact layers for a thin film transistors;
    forming a photoresist on the data metal layer;
    exposing a first amount of light onto the photoresist at first regions, excluding a second region where data lines and thin film transistors are to be formed, by using a maskless exposing device;
    exposing a second amount of light onto the photoresist at third regions, where channels of the thin film transistors are to be formed, wherein the second amount of light is smaller than the first amount of light; and
    developing the first, second and third regions of the photoresist.

2. The method of claim 1, wherein the substrate on which the data metal layer is formed is divided into a plurality of exposure regions, and mutually adjacent exposure regions of the plurality of exposure regions overlap with each other and are exposed to lego patterns.

3. The method of claim 1, wherein, when the photoresist is developed, a first thickness of the photoresist at the third regions where the TFT channel is to be formed is smaller than a second thickness of the photoresist at the second regions where source and drain electrodes of the TFTs are to be formed.

4. The method of claim 1, wherein the exposing the first amount of light and the exposing the second amount of light use a digital micro-mirror device to perform maskless exposing.

5. The method of claim 4, wherein the digital micro-mirror device includes:
    a memory cell for storing light exposure data for the exposing the first amount of light and the exposing the second amount of light; and
    a micro-mirror controlled to be turned on or off according to an application of the light exposure data.

6. The method of claim 5, wherein the substrate is divided into a plurality of exposure regions, and the light exposure data includes data corresponding to lego patterns that are united as the mutually adjacent exposure regions of the plurality of exposure regions overlap with each other.

7. The method of claim 5, wherein the exposing the first amount of light and the exposing the second amount of light use light reflected by digital micro-mirror device turned on as the light exposure data is applied to digital micro-mirror device.

8. The method of claim 5, wherein a first exposure time during which the digital micro-mirror device is turned on for the exposing the first amount of light is longer than a second exposure time during which the digital micro-mirror device is turned on for the exposing the second amount of light.

9. A method for manufacturing a thin film transistor substrate using a maskless exposing device, comprising:
    forming a gate pattern and common electrodes on a substrate through a first process with a single exposure using a maskless exposing device;
    forming a gate insulation layer, an active layer, and an ohmic contact layer, and a data pattern through a second process with two exposures using the maskless exposing device;
    forming a passivation layer through a third process with a single exposure using the maskless exposing device; and
    forming a transparent conductive pattern through a fourth process with a single exposure using the maskless exposing device.

10. The method of claim 9, wherein the substrate on which the data metal layer is formed is divided into a plurality of exposure regions, and mutually adjacent exposure regions of the plurality of exposure regions overlap with each other and exposed according to lego patterns.

11. The method of claim 9, wherein the two exposures use different amounts of light exposure.

12. The method of claim 9, wherein the two exposures include:
    exposing a first amount of light onto the photoresist at first regions, excluding a second region where data lines and thin film transistors are to be formed, by using a maskless exposing device; and exposing a second amount of light onto the photoresist at third regions, where channels of the thin film transistors are to be formed, wherein the second amount of light is smaller than the first amount of light.

13. The method of claim 12, wherein the exposing the first amount of light and the exposing the second amount of light use a digital micro-mirror device to perform maskless exposing.

14. The method of claim 13, wherein the digital micro-mirror device includes:
a memory cell for storing light exposure data for the exposing the first amount of light and the exposing the second amount of light; and
a micro-mirror controlled to be turned on or off according to an application of the light exposure data.

15. The method of claim 14, wherein the substrate is divided into a plurality of exposure regions, and the light exposure data includes data corresponding to lego patterns that are united as the mutually adjacent exposure regions of the plurality of exposure regions overlap with each other.

16. The method of claim 14, wherein the exposing the first amount of light and the exposing the second amount of light use light reflected by digital micro-mirror device turned on as the light exposure data is applied to digital micro-mirror device.

17. The method of claim 14, wherein a first exposure time during which the digital micro-mirror device is turned on for the exposing the first amount of light is longer than a second exposure time during which the digital micro-mirror device is turned on for the exposing the second amount of light.

* * * * *